March 13, 1962 T. C. PEPERISSA ET AL 3,025,410
TRANSISTOR SWITCHING DEVICE
Filed April 29, 1960
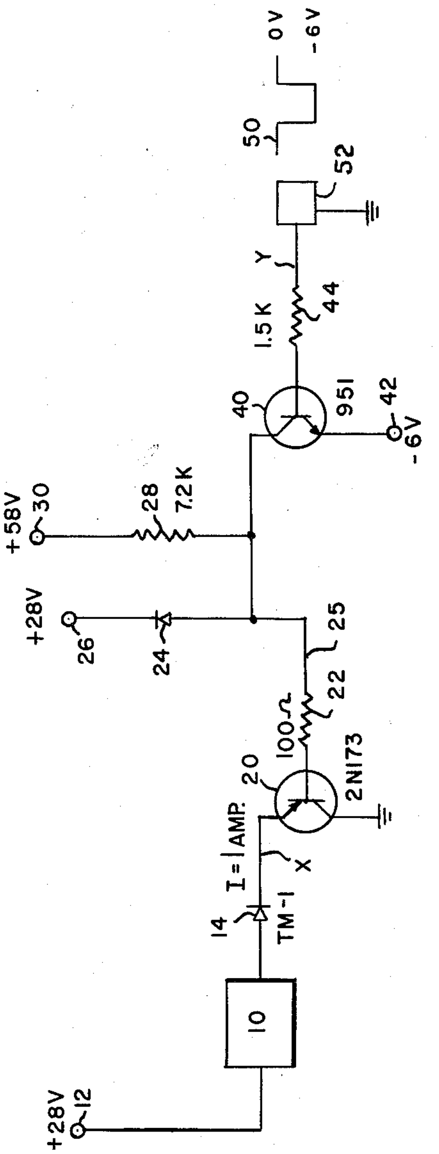
INVENTORS
THOMAS C. PEPERISSA
ABRAHAM PRESSMAN
BY Wade Koontz
ATTORNEY
George O. Saile
AGENT 3,025,410

TRANSISTOR SWITCHING DEVICE

Thomas C. Peperissa, Ambler, and Abraham Pressman, Philadelphia, Pa., assignors to the United States of America as represented by the Secretary of the Air Force Filed Apr. 29, 1960, Ser. No. 25,813
3 Claims. (Cl. 307—88.5)

The invention relates to a voltage controlled switching device for series connection between a load and a source of direct current power.

It is the object of this invention to provide a new voltage controlled transistor switching device capable of a high degree of reliability and a wide temperature range of operability.

According to the invention, a load which operates from a source of direct current power is controlled by a switching device which includes two transistors in series with the load. The emitter-collector path of the first transistor is connected in series between the load and the power source. Reverse biasing means are connected in series between the base and collector of the first transistor. The second transistor has the reverse biasing means connected in series between its collector and base, thusly biasing its collector-base junction in the reverse direction. A further source of bias voltage is provided between the emitter and base of the second transistor to bias the emitter-base junction in the forward direction. A source of control voltage is coupled to the base of the second transistor. The magnitude and polarity of the control signal is such as to cancel the bias voltage at the emitter-base junction of the second transistor.

The nature of the invention, further objects and advantages will appear more fully on consideration of the embodiments illustrated in the accompanying drawing and hereinafter to be described.

The drawing is a schematic illustration of the novel transistor switching circuit.

Referring now to the drawing, the electrical device 10 can be, for example, a bank of relays, a solenoid or a small motor. Terminal 12 is connected to a positive source of voltage for the operation of the electrical device 10.

A control signal source 52 produces the control signal 50. The control signal graphically indicated at 50 is applied through resistor 44 to a second transistor 40. The transistor 40 is a NPN type transistor. The emitter electrode of transistor 40 is connected to a negative potential point 42. The collector of the second transistor 40 is coupled through a connecting line 25 to a first transistor 20. The transistor 20 is a PNP type transistor.

In the base circuit of the first transistor 20, a high positive voltage D.C. supply connected to point 30 and a resistor 28 provide back bias so that the leakage current of the first transistor 20 is kept low. The high voltage at point 30 is coupled to the connecting line 25 through resistor 28. A second source of positive D.C. potential 26 is provided in the base circuit. This second point is substantially less positive than the high voltage supply 30. A diode 24 is positioned between the second point of voltage 26 and the connecting line 25. The diode 24 clamps the voltage of the base circuit at the potential of the second point of voltage 26. A resistor 22 is provided in connecting line 25 between the voltage points 26, 30 connections to the line 25 and the base of transistor 20.

The emitter electrode of the transistor 20 is connected to the electrical device 10 through a silicon rectifier 14. The rectifier 14, also, is provided to keep the leakage current of transistor 20 low. The collector electrode of the transistor 20 is connected to a source of reference potential.

The component values and the semiconductor types indicated in the drawings are only representative and are given solely as an aid to understanding the operation of the novel circuit.

The operation of the nevel circuit is begun by application of a control signal 50 to line Y. When the control signal is zero volts D.C., the NPN transistor 40 will conduct. This brings the collector electrode of transistor 40 to a negative D.C. voltage equal to that of the point of negative potential 42. The base electrode of the PNP transistor 20 is at a less potential than its emitter, thereby allowing conduction of the current I through transistor 20. Point X is then at ground potential. When the control signal is negative six volts D.C., the NPN transistor 40 will not be conducting. This results in bringing the collector of transistor 40 to a voltage that is positive with respect to point 26 of the drop in diode 24. The base electrode of the PNP transistor 20 is at a positive potential with respect to its emitter thereby cutting off the transistor 20. Point X is then at the positive operating voltage of the elecrical device. There is no drop across load 10 and it is nonoperating.

This novel circuit with the component values and semiconductor types indicated as representative in the drawing can be used to control any device that operates from a twenty-eight volt D.C. source. The circuit's carrying capacity is one ampere. This capacity can be increased by varying the drive on transistor 20. The operating temperature range is $-55°$ C. to $+75°$ C.

The invention is not limited to the examples of embodiments shown and described, but may on the contrary, be capable of many modifications.

We claim:

1. A voltage controlled switching device for series connection between a load and a source of direct current power, said device comprising: a second transistor having emitter, collector and base electrodes, a control signal source, said base of said second transistor being connected to said control signal source, a source of negative potential, means for connecting said emitter of said second transistor to said source of negative potential, said second transistor being a NPN type transistor, a first transistor having an emitter, collector and base electrodes, means for coupling said base of said first transistor to said collector of said second transistor, means for clamping the base voltage of said first transistor at a predetermined positive value, said collector of said first transistor being connected to a point of reference potential, means for connecting said emitter of said first transistor to said load, said first transistor being a PNP type transistor, and means for keeping leakage current low in said first transistor.

2. A voltage controlled switching device for series connection between a load and a source of direct current power, said device comprising: a second transistor having emitter, collector and base electrodes, a control signal source, said base of said second transistor being connected to said control signal source, a source of negative potential equal in magnitude to the most negative value obtainable from the said control signal source, means for connecting said emitter of said second transistor to said source of negative potential, said second transistor being a NPN type transistor, a first transistor having an emitter, collector and base electrodes, means for coupling said base of said first transistor to said collector of said second transistor, means for clamping the base voltage of said first transistor at a predetermined positive value, said collector of said first transistor being connected to a point of reference potential, a silicon rectifier, means for connecting said emitter of said first transistor to said load through said rectifier, said first transistor being a PNP type transistor, and means for providing back bias for said base of said first transistor.

3. A voltage controlled switch device for series connection between a load and a source of direct current power, said device comprising: a second transistor having emitter, collector and base electrodes, a control signal source, said base of said second transistor being connected to said control signal source, a source of negative potential equal in magnitude to the most negative value obtainable from the said control signal source, means for connecting said emitter of said second transistor to said source of negative potential, said second transistor being a NPN type transistor, a first transistor having an emitter, collector and base electrodes, means for coupling said base of said first transistor to the said collector of said second transistor, a source of positive potential, a diode for clamping the base voltage of said first transistor at the said positive potential, means connecting said source of positive potential through said diode to said means for coupling, said collector of said first transistor being connected to a point of reference potential, a silicon rectifier, means for connecting said emitter of said first transistor to said load through said rectifier, said first transistor being a PNP type transistor, and means for providing back bias for said base of said first transistor.

References Cited in the file of this patent

UNITED STATES PATENTS

| | | |
|---|---|---|
| 2,751,550 | Chase | June 19, 1956 |
| 2,823,322 | Trousdale | Feb. 11, 1958 |
| 2,939,967 | Redpath et al. | June 7, 1960 |